United States Patent [19]

Saccocio et al.

[11] Patent Number: 4,675,269
[45] Date of Patent: Jun. 23, 1987

[54] FREE PARTICLE ABRASION DEVELOPMENT OF IMAGING SHEETS EMPLOYING PHOTOSENSITIVE MICROCAPSULES

[75] Inventors: Edward J. Saccocio, Columbus; T. Kay Kiser, Chillicothe; Richard F. Wright, Chillicothe; Donald L. Head, Chillicothe, all of Ohio

[73] Assignee: The Mead Corporation, Dayton, Ohio

[21] Appl. No.: 815,850

[22] Filed: Jan. 3, 1986

Related U.S. Application Data

[62] Division of Ser. No. 670,447, Nov. 13, 1984, Pat. No. 4,578,340.

[51] Int. Cl.⁴ .................... G03D 13/00; G03D 13/04; B02C 19/12
[52] U.S. Cl. .................. 430/138; 241/199.7; 241/199.12; 354/301; 427/11; 427/150; 427/151; 428/402.2; 428/402.21; 428/402.22
[58] Field of Search ............... 430/138; 241/199.7, 241/199.12; 354/301; 427/11, 150, 151; 428/402.2, 402.21, 402.22

[56] References Cited

U.S. PATENT DOCUMENTS

| | | | |
|---|---|---|---|
| 3,535,140 | 10/1970 | Busch | 427/150 |
| 3,632,378 | 1/1972 | Busch | 427/150 |
| 4,106,932 | 8/1978 | Blachford | 264/4.7 X |
| 4,211,437 | 7/1980 | Myers et al. | 427/150 X |
| 4,282,275 | 8/1981 | Werner | 427/150 X |
| 4,440,846 | 4/1984 | Sanders et al. | 430/138 |
| 4,448,516 | 5/1984 | Arney et al. | 355/27 |
| 4,578,340 | 3/1986 | Saccocio et al. | 430/138 |

Primary Examiner—John E. Kittle
Assistant Examiner—Mukund J. Shah
Attorney, Agent, or Firm—Biebel, French & Nauman

[57] ABSTRACT

Imaging sheets having a coating containing chromogenic material and a photosensitive composition, with at least the photosensitive composition encapsulated in rupturable microcapsules as an internal phase, are processed by free particle abrasion to rupture the microcapsules coating the surfaces of the imaging sheets by establishing relative motion between the imaging sheets and a body of free particles.

7 Claims, 10 Drawing Figures

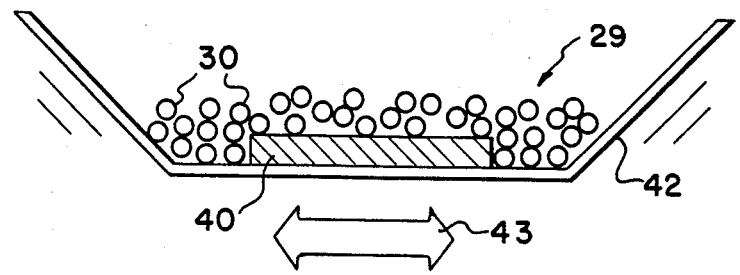
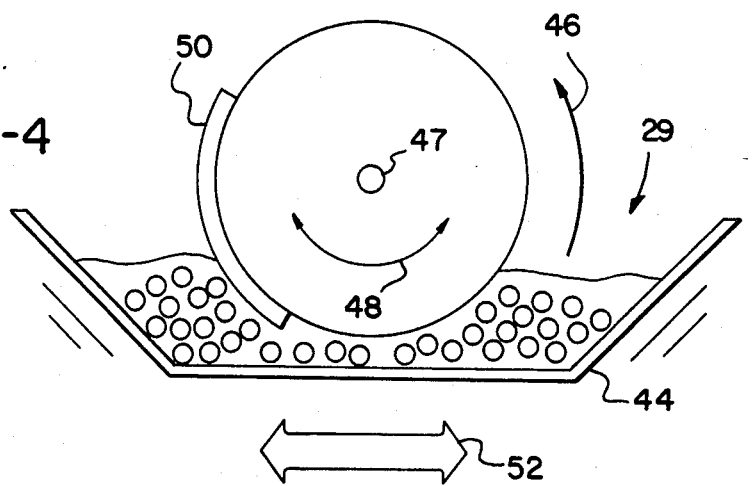

FREE PARTICLE ABRASION DEVELOPMENT OF IMAGING SHEETS EMPLOYING PHOTOSENSITIVE MICROCAPSULES

This is a division of application Ser. No. 670,447, filed Nov. 13, 1984, now U.S. Pat. No. 4,578,340.

BACKGROUND OF THE INVENTION

The present invention relates generally to an imaging system utilizing imaging sheets having a surface coating of rupturable photosensitive microcapsules and, more particularly, to a method and apparatus for processing such imaging sheets.

U.S. Pat. Nos. 4,440,846 and 4,399,209, which are assigned to The Mead Corporation and herein incorporated by reference, describe an imaging system wherein a photosensitive layer comprising microcapsules containing a photosensitive composition in the internal phase is image-wise exposed to actinic radiation and subjected to a uniform rupturing force whereupon the microcapsules rupture and image-wise release the internal phase. The imaging system is particularly advantageous because it is a totally dry system and does not rely upon the application of wet development processing solutions to produce the image. An image-forming chromogenic material, such as a substantially colorless color former, is typically associated with the microcapsules. When the microcapsules rupture, the color former image-wise reacts with a developer material and produces a color image. In the embodiments described in the referenced patents, the microcapsules are typically ruptured by passing image-wise exposed imaging sheets through the nip between a pair of calender rollers.

While heavy pressure is not required to rupture the microcapsules, high pressure and large calender rollers are normally used to develop the imaging sheets. Even carefully machined metal calender rollers have uneven surfaces. If one roller is simply rested upon another, the surfaces of the rollers are not in contact over the entire length of the rollers. By applying pressure to the rollers, the uneven surfaces or surface irregularities are "smoothed out" to provide a uniform contact line between the rollers. The high pressure and large size of the rollers are necessary to achieve a uniform distribution of the rupturing force across the surface of the imaging sheets. If the rupturing force is not uniformly distributed, the imaging sheets develop unevenly and the tonal characteristics of the resulting images are not good.

As the width of the imaging sheets and the corresponding length of the calender rollers increases, the diameter of the rollers must also be increased to maintain sufficient stiffness such that pressure applied to the ends of the rollers is distributed evenly across the entire expanse of the rollers. As a general rule, as the length of the rollers is doubled, the diameter of the rollers must be cubed in order to maintain sufficient stiffness. Thus, as the size of the imaging sheets increases, the cost and size of effective pressure type development apparatus becomes prohibitive. In particular, while larger pressure rollers may be accommodated in development apparatuses designed to develop relatively small copies, e.g., 8 to 12 inches in width, in certain applications such as color proofing, large copy widths, sometimes in excess of 36 inches, are used. These copies are so large as to make it impractical to develop them using pressure rollers.

An additional drawback of pressure processing imaging sheets is that when high pressures are applied to the calender rollers, as required to overcome surface irregularities and achieve uniform development across the roller, some of the midtone quality of the developed images is lost. This is apparently due to a loss of a differential microcapsule rupture and is referred to as "midtone mottle". Tnus, a number of difficulties have been encountered in designing pressure type development apparatus for the aforementioned imaging sheets.

An improved arrangement for processing imaging sheets without high pressure and bulky calender rollers is disclosed in commonly assigned U.S. Patent No. 4,448,516, which is herein incorporated by reference. In this patent, the imaging sheets are passed over a developer roll having a fibrous outer surface. The developer roll is rotated in contact with the imaging sheets to rupture the microcapsules on the sheets. The developer roll is an improvement over the bulky high pressure calender rollers and has advantages over the alternative proposals disclosed in the first referenced patents.

New alternatives which offer inexpensive techniques for developing imaging sheets and may be preferred for selected applications are in demand and serve to advance the art of imaging systems utilizing the imaging sheets of the first referenced patents.

SUMMARY OF THE INVENTION

The term "microcapsule" as used herein refers to both microcapsules having a discrete microcapsule wall and microcapsules formed in a so-called open phase system the internal phase constituents are simply dispersed in a binder.

The term "photosensitive composition" means a composition which changes viscosity upon exposure to actinic radiation.

The term "chromogenic material" refers to the color forming reactant which is encapsulated or otherwise associated with the microcapsules. The term "developer" refers to the reactant not associated with the microcapsules.

In accordance with the present invention, imaging sheets are processed by free particle abrasion. In its broadest sense, the present invention relates to a method and apparatus for rupturing the microcapsules which form a photosensitive layer of the aforementioned imaging sheets by forming a body of free particles and establishing relative movement between the surface of an imaging sheet and the body of free particles such that the free particles move over the microcapsules on the surface of the imaging sheet and thereby abrade and rupture the microcapsules. The latent image in the imaging sheet is developed if the microcapsules are ruptured in the presence of a developer. A developer can be provided as a coating on the imaging sheet itself or may be intermixed with the body of free particles such that as the microcapsules are ruptured, the developer and a chromogenic material, such as a colorless color former, interact and form the image. As a further alternative, the microcapsules can be ruptured by contacting a first body of free particles and the developer can be applied later.

In a first embodiment of the present invention, an imaging sheet is placed into a tray with the body of free particles and the tray is vibrated such that free particles move across the surface of the imaging sheet abrading and rupturing the microcapsules thereon.

A second embodiment for performing free particle abrasion development of imaging sheets comprises a tray for supporting a body of free particles and a cylinder mounted for rotation above the tray and located relative to the tray such that a sector of the circumference of the cylinder extends into the body of free particles. An imaging sheet is processed by securing it to the cylinder and rotating the cylinder such that the surface of the imaging sheet contacts the body of free particles. This embodiment may be enhanced by vibrating the tray as the cylinder is rotated.

A third embodiment for performing free particle abrasion development of imaging sheets in accordance with the present invention comprises a primary cylindrical drum mounted for rotation about a horizontal axis. In this embodiment, an imaging sheet is positioned along the interior surface of the drum and the body of free particles is placed into the drum. The drum is then rotated such that free particles move over the surface of the imaging sheet and abrade and rupture the microcapsules thereon. Preferably, the speed of rotation of the primary cylindrical drum is selected such that the free particles are carried partially up the interior surface of the drum and then return toward the bottom of the drum in an oscillatory wave-like motion.

To ensure proper operation of the third embodiment of the present invention, the imaging sheet or substrate may be retained substantially against the interior surface of the drum by means of clamping members. Alternately, a secondary cylindrical substrate retaining drum may be positioned concentrically within the primary cylindrical drum, with the substrate and the free particles being positioned between the primary and secondary drums. In each of the aforementioned embodiments, the developer can be carried on the imaging sheet, be intermixed with the body of free particles hence applied from the body of free particles or be applied separately after the microcapsules are ruptured.

It is, therefore, an object of the present invention to provide a method and apparatus for processing imaging sheets by means of free particle abrasion such that microcapsules on imaging sheets are contacted by free particles in the presence of a developer to thereby rupture the microcapsules and permit chromogenic material associated with the microcapsules to interact with the developer and thereby develop latent images in the imaging sheets.

Other objects and advantages of the invention will be apparent from the following description, the accompanying drawings and the appended claims.

BRIEF DESCRIPTION OF THE DRAWINGS

FIGS. 3–6 are schematic cross-sectional views of illustrative embodiments of apparatus for processing imaging sheets in accordance with the present invention.

DETAILED DESCRIPTION OF THE INVENTION

Figure 1A:
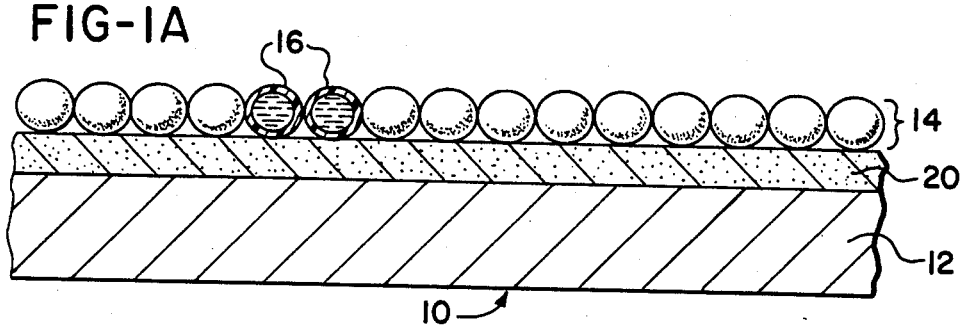
FIGS. 1A–1C show a self-contained imaging sheet and the processing of the imaging sheet in accordance with the present invention.
Figure 2A:
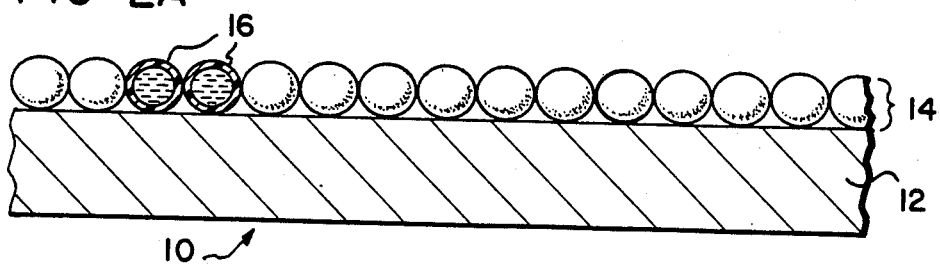
FIGS. 2A–2C show a transfer imaging sheet and the processing of the transfer imaging sheet in accordance with the present invention.

FIGS. 1A and 2A illustrate embodiments of the imaging sheets in accordance with referenced U.S. Pat. Nos. 4,440,846 and, 4,399,209, respectively. Therein, an imaging sheet 10 is constituted by a substrate 12 coated with a layer of microcapsules 14. The microcapsules 14 are filled with an internal phase 16 containing a photosensitive composition. Usually, the microcapsules also contain the chromogenic material, however, the chromogenic material can be associated with the microcapsules in other ways such as by incorporation into the microcapsule wall or in a layer contiguous with the microcapsules.

In actuality, the microcapsules 14 are not visible to the unaided eye since the mean size of the microcapsules generally ranges from approximately 1 to 25 microns. In the imaging sheet 10 shown in FIG. 1A, a layer of developer material 20 is interposed between the layer of microcapsules 14 and the substrate 12.

Figure 1B:
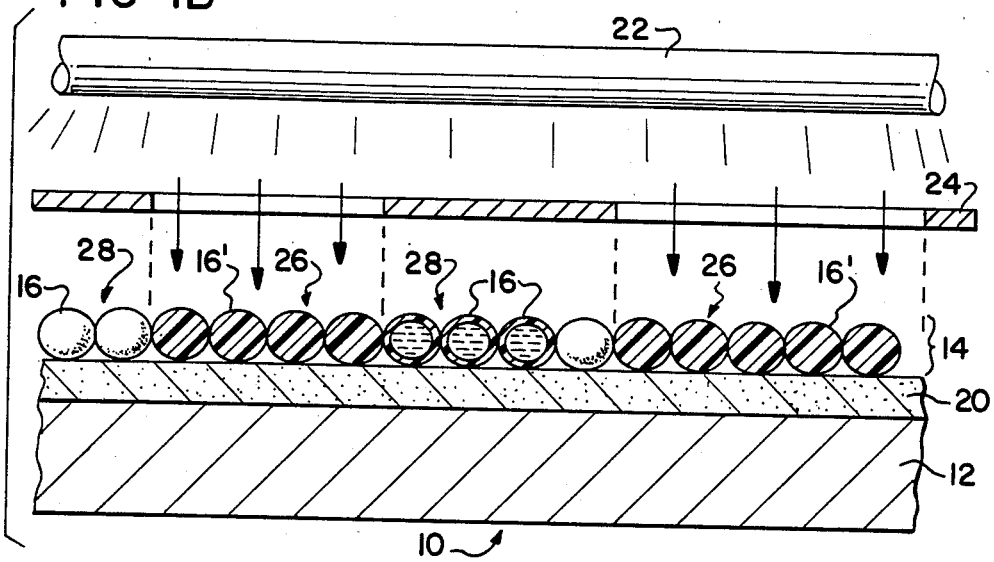
Figure 1C:
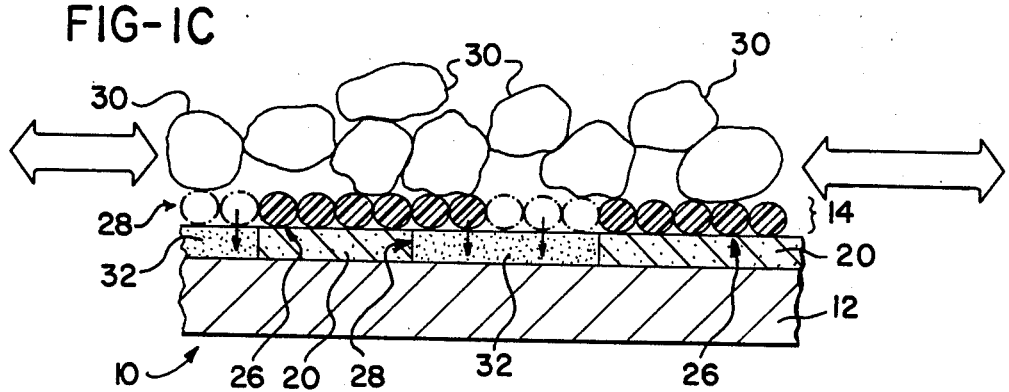
Figure 2B:
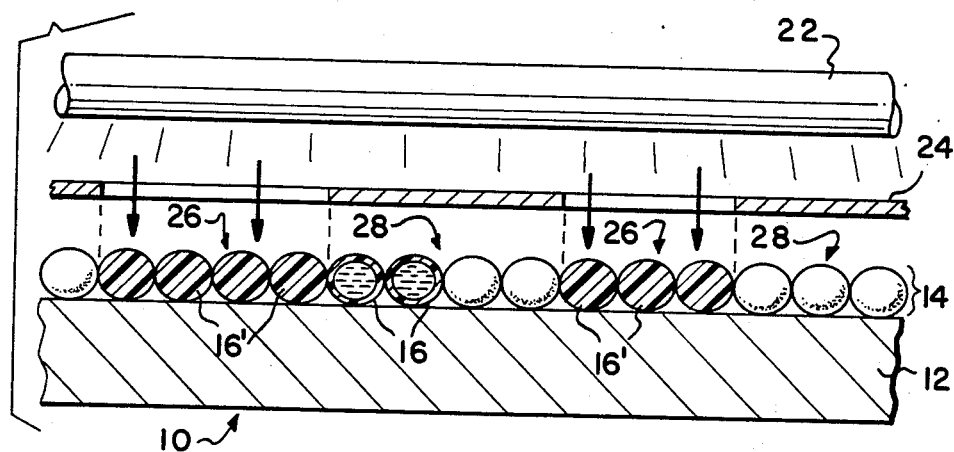

Exposure of the imaging sheets 10 by transmission imaging is shown in FIGS. 1B and 2B wherein a source of radiant energy 22 is positioned above the surface of the imaging sheets 10 with a mask 24 positioned therebetween. In the illustrations of FIGS. 1 and 2, the substrate 12 is opaque and the photosensitive material within the microcapsules 14 is a positive working radiation-curable material, i.e., the viscosity of the material increases upon exposure to actinic radiation.

Irradiation of the exposed areas 26 causes the radiation curable composition in the internal phase 16 of the microcapsules 14 to polymerize thereby gelling, solidifying or otherwise immobilizing the chromogenic material and preventing the chromogenic material from reacting with the developer material. To simplify the illustration, internal phase 16' in the exposed areas 26 is shown as a solid; whereas, the internal phase 16 remains liquid in the unexposed areas 28.

Figure 2C:
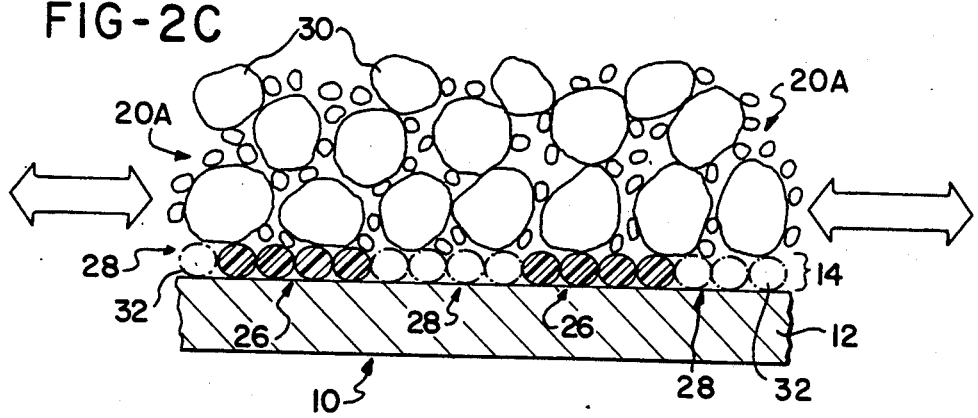

FIGS. 1C and 2C illustrate schematically the processing of the imaging sheets 10 in accordance with the present invention to rupture the microcapsules 14 such that the chromogenic material contained within the microcapsules 14 or otherwise associated therewith can interreact with developer. The imaging sheets 10 are processed by free particle abrasion to rupture the microcapsules 14 by shear forces parallel to the surface of the imaging sheets as opposed to pressure forces normal thereto.

A body of free particles 29 shown in FIGS. 3-6 and comprising individual particles 30 contact the coated surface of the imaging sheets 10 to thereby rupture the microcapsules 14 by means of shear forces which are applied to the microcapsules 14 as the imaging sheet 10 and the particles 30 of the body of free particles 29 are moved relative to one another. The microcapsules 14, the particles 30 and the developer 20,20A are not shown to size either actual, as noted above, or relative, but are shown to more clearly illustrate the invention of the present application. As the particles 30 move over the microcapsules 14, they abrade and thereby rupture the microcapsules.

For simplification, the microcapsules 14 are shown as being ruptured in the unexposed area 28 and unruptured in the exposed area 26. In actuality, all or a portion of the microcapsules may also be ruptured in the exposed area 26. In unexposed areas 28, the chromogenic material and a developer react to form a visible image 32.

As shown in FIG. 1C where an intermediate layer of developer 20 is positioned between the substrate 12 and the layer of microcapsules 14, the chromogenic material from the ruptured microcapsules in the unexposed areas 28 passes to the portions of the developer 20 which form the visible image 32 by interaction between the chromogenic material and the developer. For the imaging sheet 10 shown in FIG. 2C which is normally utilized for transfer imaging, finely divided particles 20A of a developer are interspersed with the particles 30 of the body of free particles 29 such that when th microcapsules 14 in the unexposed areas 28 of the microcapsules 14 are ruptured, the finely divided developer 20A mixes and interreacts with the chromogenic material contained within or associated with the ruptured microcapsules 14 to form the image 32. As an alternate method of applying the developer, it can be applied downstream of the free particle body by dusting or by application from a separate sump.

The size and density of the particles 30 must be maintained within limits. In particular, if the particles become too large, the number of point contacts with the imaging sheet is reduced and it becomes more difficult to develop the image or the development time becomes excessive. Similarly, if the particles are too small, they do not have sufficient weight and consequently, there is not enough shear force to rupture the microcapsules and develop the imaging sheet. More dense particles are preferred. The presently preferred material for making the particles is iron although various sands have also been successfully used. The recommended particle size ranges from about 250 to 750 microns and the recommended density from about 2.0 to 5.0.

The shape of the particles 30 is also a consideration in the present invention. Surprisingly, preliminary results indicate that the particles 30 are preferably round as opposed to irregular or angularly shaped. It is also desirable to coat the particles with various polymers. In the case of iron particles, the coating prevents rust. Such coatings also function to increase friction and to repel oil that is released from the microcapsules upon rupture. For the noted microcapsule size range of 1-25 microns, preliminary results indicate that nearly round approximately 1 mm in diameter iron balls coated with a vinyl polymer are preferred.

Even if the particles 30 are coated with a polymer, oil still tends to accumulate on the particles. After a given amount of oil accumulation on the particles, background coloring (fog) begins to increase. Accordingly, after a number of sheets have been developed in a given body of free particles, the free particles must be replaced similar to the addition of toner in a typical xerographic reproduction machine. In fact, if the transfer imaging sheet shown in FIGS. 2A-2C is used, as the free particles are changed, the developer 20A is replenished again resembling the replacement of toner in xerographic reproduction machines.

A variety of illustrative embodiments of apparatus for performing free particle abrasion to rupture microcapsules coating the surfaces of imaging sheets are shown in FIGS. 3-6. In the simplest form of apparatus for performing free particle abrasion, a substrate or imaging sheet 40 is placed into a tray 42, with the body of free particles 29 also placed into the tray 42 over the imaging sheet 40. The tray 42 is then vibrated as indicated by an arrow 43 such that the free particles 30 of the body of free particles 29 move over the surface of the imaging sheet 40 to thereby abrade and rupture the microcapsules forming a layer on the upper surface of the imaging sheet 40. The tray 42 is vibrated with a vibration rate of approximately 100 hertz, the presently preferred rate of vibration.

A second illustrative embodiment of apparatus for performing free particle abrasion of imaging sheets is shown in FIG. 4. Therein, a tray 44 supports the body of free particles 29 and a cylinder 46 is horizontally mounted above the tray 44 for rotation about an axis 47. The cylinder 46 is located relative to the tray 44 such that a sector 48 of the circumference of the cylinder 46 extends into the body of free particles 29. An imaging sheet 50 is secured to the cylinder 46 such that the surface of the imaging sheet 50 which is mounted with the microcapsules facing outwardly. The imaging sheet 50 is then processed by rotating the cylinder 46 such that the coated surface of the imaging sheet 50 contacts the body of free particles 29. The operation of the embodiment of FIG. 4 may be enhanced by vibrating the tray 44 as the cylinder 46 is rotated, such vibration being indicated by an arrow 52.

Figure 5:
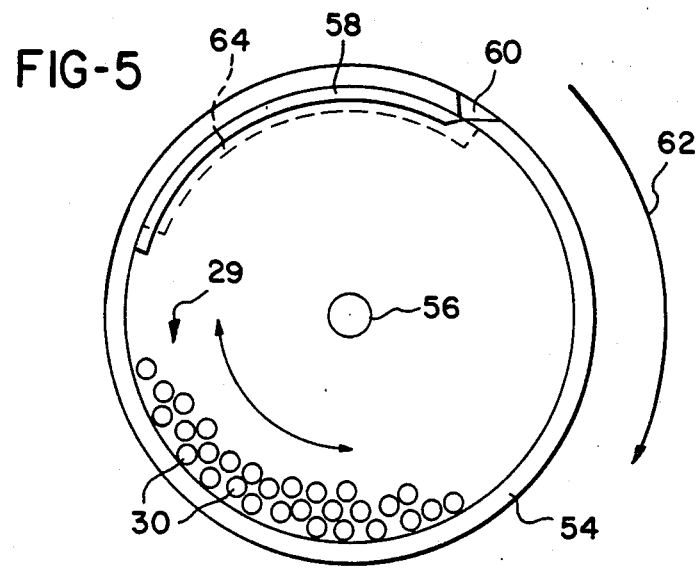

A third embodiment of apparatus for performing free particle abrasion of imaging sheets in accordance with the present invention is shown in FIG. 5. In this embodiment, a primary cylindrical drum 54 is mounted for rotation about a horizontal axis 56. An imaging sheet 58 is positioned along the interior of the surface of the drum 54 by means of insertion through a slot 60 which is angled in the direction of drum rotation indicated by the arrow 62. The imaging sheet 58 can be held against the inside of the drum 54 by means of clamping members 64 which are optional and generally not necessary.

As the drum 54 is rotated, the free particles 30 of the body of free particles 29 move over the surface of the imaging sheet 58 to abrade and rupture the microcapsules thereon. Preferably, the speed of rotation of the primary cylindrical drum 54 is limited such that the particles 29 do not tumble, i.e., the particles are not thrown around in the drum, and are not held against the interior of the drum 54 by centrifugal forces. Rather, the speed is selected such that the free particles are carried partially up the interior surface of the drum and then return toward the bottom of the drum in an oscillatory wave-like motion defining a swishing action.

Figure 6:
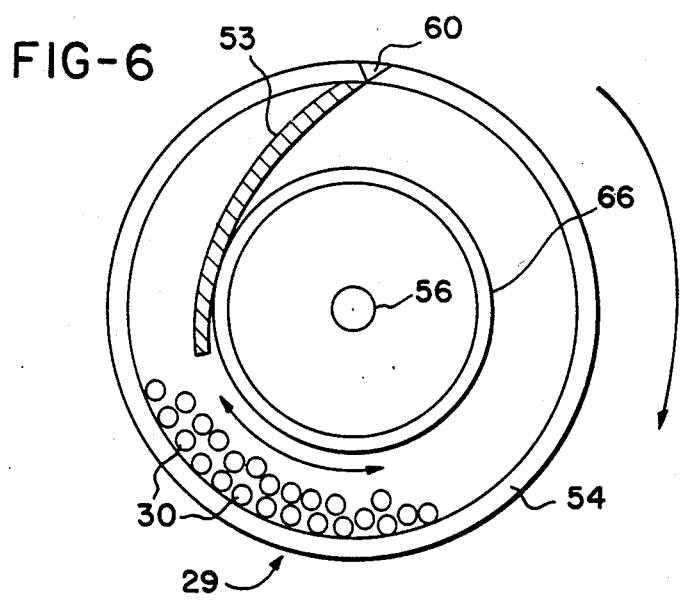

A fourth embodiment of apparatus for performing free particle abrasion of imaging sheets in accordance with the present invention is shown in FIG. 6. This embodiment comprises a modification of the embodiment of FIG. 5 and, accordingly, corresponding elements will be labeled the same in FIGS. 5 and 6. In FIG. 6, a secondary cylindrical substrate retaining drum 66 is positioned concentrically within the primary cylindrical drum 54, with the imaging sheet 58 and the body of free particles 29 being inserted between the primary drum 54 and the secondary drum 66. In the embodiment of FIG. 6, the imaging sheet 58 is retained substantially against the interior surface of the primary drum 54 by means of the secondary drum 66.

The drawings of FIGS. 3-6 are drawn to schmatically illustrate apparatus in accordance with the present invention and are not drawn to scale which, to a large extent, is determined by the imaging sheets to be processed. In particular, the dimensions of the drum and the drum arrangement of FIG. 6 are such that the interior or secondary drum 66 is approximately 1 inch smaller in diameter than the outer or primary drum 54. Further, it should be noted that there is no reason that an imaging sheet cannot extend completely around and entirely cover the interior surface of the primary drum 54 since the developing action performed in accordance with the present invention is uniform throughout the interior surface of the primary drum 54.

It is apparent that a method and inexpensive apparatus for processing imaging sheets by means of free particle abrasion such that microcapsules on the imaging sheets are contacted by free particles of a body of free particles in the presence of a developer to thereby rupture the microcapsules and permit chromogenic material coating the sheets to interact with the developer and thereby develop latent images on the imaging sheets has been disclosed. While a variety of embodiments have been disclosed for performing free particle abrasion of imaging sheets, many other arrangements will be apparent to those skilled in the art after a review of the above disclosure.

While the methods herein described and the forms of apparatus for carrying these methods into effect constitute preferred embodiments of this invention, it is to be understood that the invention is not limited to these precise methods and forms of apparatus and that changes may be made in either without departing from the scope of the invention which is defined in the appended claims.

What is claimed is:

1. Apparatus for rupturing photosensitive microcapsules which form a layer on the surface of an imaging sheet comprising:
    a body of free particles; and
    mobile means receiving said imaging sheet for establishing relative movement between said imaging sheet and said free particles such that said free particles move over said imaging sheet and rupture said microcapsules.

2. Apparatus for rupturing microcapsules as claimed in claim 1 wherein said mobile means comprises a tray mounted for vibratory motion and adapted to receive said imaging sheet and said free particles.

3. Apparatus for rupturing microcapsules as claimed in claim 1 further comprising a tray for receiving said free particles and wherein said mobile means comprises a cylinder mounted for rotation above said tray, said cylinder being adapted to receive said imaging sheet and positioned relative to said tray such that said imaging sheet passes through said free particles as said cylinder is rotated.

4. Apparatus for rupturing microcapsules as claimed in claim 3 wherein said tray is mounted for vibratory motion.

5. Apparatus for rupturing microcapsules as claimed in claim 1 wherein said mobile means comprises a primary hollow cylindrical drum mounted for rotation and adapted to receive said imaging sheet and said free particles therewithin such that said free particles move over said microcapsules and rupture them as said primary cylinder is rotated.

6. Apparatus for rupturing microcapsules as claimed in claim 5 wherein said drum comprises clamp means for securing said imaging sheet against the interior thereof.

7. Apparatus for rupturing microcapsules as claimed in claim 5 further comprising a secondary cylindrical drum concentrically positioned within and spaced apart from said primary drum, said free particles and said imaging sheet being received between said primary and secondary drums such that said microcapsules are engaged by said free particles as said primary drum is rotated and said imaging sheet is retained substantially adjacent the interior wall of said primary drum by said secondary drum.

* * * * *